United States Patent
Yeo

(10) Patent No.: US 9,279,843 B2
(45) Date of Patent: Mar. 8, 2016

(54) CHARGE TRANSFER CIRCUIT FOR CAPACITIVE SENSING

(71) Applicant: Hyeop Goo Yeo, Hwaseong-si (KR)

(72) Inventor: Hyeop Goo Yeo, Hwaseong-si (KR)

(73) Assignee: Hanshin University Industry-Academic Cooperation Foundation, Gyeonggi-Do (KR)

( * ) Notice: Subject to any disclaimer, the term of this patent is extended or adjusted under 35 U.S.C. 154(b) by 0 days.

(21) Appl. No.: 14/448,431

(22) Filed: Jul. 31, 2014

(65) Prior Publication Data

US 2015/0108955 A1   Apr. 23, 2015

(30) Foreign Application Priority Data

Oct. 19, 2013  (KR) .......................... 10-2013-0129553

(51) Int. Cl.
*H03B 1/00*    (2006.01)
*G01R 27/26*   (2006.01)

(52) U.S. Cl.
CPC .................................. *G01R 27/2605* (2013.01)

(58) Field of Classification Search
None
See application file for complete search history.

(56) References Cited

U.S. PATENT DOCUMENTS

| 6,614,291    | B1* | 9/2003  | Zhao et al.  | 327/408 |
| 8,390,361    | B2* | 3/2013  | Ningrat      | 327/337 |
| 2012/0326734 | A1* | 12/2012 | Cho et al.   | 324/684 |
| 2013/0162857 | A1* | 6/2013  | Kwon et al.  | 348/222.1 |

OTHER PUBLICATIONS

Hyeopgoo Yeo; A Parasitic-Insensitive Charge Transfer Circuit for Capacitive Sensing using Active Output VoltageFeedback Technique; Journal; Jul. 31, 2013; 9 pages; vol. 4; Journal of Next Generation Information Technology.

* cited by examiner

*Primary Examiner* — Long Nguyen
(74) *Attorney, Agent, or Firm* — Reinhart Boerner Van Deuren P.C.

(57) ABSTRACT

A charge transfer circuit for capacitive sensing is disclosed. The charge transfer circuit for capacitive sensing includes a variable capacitor, an X-drive unit, and an active output voltage feedback (AVF) part. The variable capacitor is disposed between the output terminal of an X-drive line and the input terminal of a Y-drive line. The X-drive unit is connected between the input unit of the X-drive line and a voltage input terminal. The active output voltage feedback (AVF) part is connected between the output terminal of the Y-drive line and a voltage output terminal. The output terminal of the AVF part is connected to the output terminal of the Y-drive line.

14 Claims, 8 Drawing Sheets

US 9,279,843 B2

CHARGE TRANSFER CIRCUIT FOR CAPACITIVE SENSING

CROSS-REFERENCE TO RELATED PATENT APPLICATIONS

This patent application claims priority to Korean Application No. 10-2013-0129553, filed Oct. 19, 2013, the entire teachings and disclosure of which are incorporated herein by reference thereto.

BACKGROUND OF THE INVENTION

1. Field of the Invention

The present invention relates generally to a charge transfer circuit for capacitive sensing and, more particularly, to a charge transfer circuit for capacitive sensing using active output voltage feedback (AVF) technology, which is insensitive to parasitic capacitance.

2. Description of the Related Art

Since capacitive sensors, such as touch screen panels (TSPs), have more advantages than other input devices, such as keyboards and mouses, they have become popular and have spread rapidly, especially in mobile systems. Capacitive sensors, such as touch input devices, provide effective and interactive input functions, such as a multi-touch function, a proximity sensing function, and a pattern input function. Furthermore, capacitive sensors are widely used for various application apparatuses for moisture sensing, bio-sensing and special purpose sensing, etc.

Recently, the sizes of display units have increased in many mobile application apparatuses, and thus display units require more touch points in order to achieve higher resolution. Electrodes generally formed of Indium Tin Oxide (ITO) in touch screen panels contain parasitic elements, such as capacitance and resistance, and these parasitic elements may incur reductions in performance in terms of both touch sensitivity and accuracy.

In order to reduce a parasitic effect, a discrete time integrators may be used as a capacitive sensor. However, since the capacitance of a touch screen panel decreases only in a touch state, a discrete time integrator uses only half of a supply voltage, and thus touch sensitivity is deteriorated.

SUMMARY OF THE INVENTION

Accordingly, the present invention has been made keeping in mind the above problems occurring in the prior art, and an object of the present invention is to provide a charge transfer circuit for capacitive sensing, which can sense capacitance without a reduction in linearity.

Another object of the present invention is to provide a charge transfer circuit for capacitive sensing, which can be effectively used in a capacitive sensor that has improved touch sensitivity over a wide dynamic range in touch apparatuses having considerable parasitic elements.

In accordance with an aspect of the present invention, there is provided a charge transfer circuit for capacitive sensing, including a variable capacitor disposed between the output terminal of an X-drive line and the input terminal of a Y-drive line; an X-drive unit connected between the input unit of the X-drive line and a voltage input terminal; and an active output voltage feedback (AVF) part connected between the output terminal of the Y-drive line and a voltage output terminal; wherein the output terminal of the AVF part is connected to the output terminal of the Y-drive line.

Each of the X-drive line and the Y-drive line may include a parasitic resistor configured such that the output or input terminal thereof is connected to the variable capacitor; and a parasitic capacitor configured such that the input terminal thereof is connected to the input or output terminal of the parasitic resistor.

The output terminal of the parasitic capacitor may be grounded.

The X-drive unit may include a first switch configured to be turned on in response to a first clock signal and to be turned off in response to a second clock signal; and a second switch configured to be turned off in response to the first clock signal and to be turned on in response to the second clock signal.

The first clock signal and the second clock signal may be clock signals that do not overlap each other.

Each of the first and second switches may be a p-channel metal-oxide semiconductor (PMOS) transistor, a re-channel metal-oxide semiconductor (NMOS) transistor, or a complementary metal-oxide semiconductor (CMOS) transistor.

A preset voltage may be applied to the voltage input terminal.

The AVF part may include third and fourth switches configured such that the output terminals thereof are connected to the output terminal of the Y-drive line; a buffer circuit unit configured such that the input terminal thereof is connected to the output terminal of the third switch; a reset switch configured such that the output terminal thereof is connected to the output terminal of the third switch and the input terminal of the buffer circuit unit and such that the input terminal thereof is connected to a reset voltage input terminal; and a storage capacitor configured such that the input terminal thereof is connected to the output terminal of the third switch and the input terminal of the buffer circuit unit and such that the output terminal thereof is grounded; wherein the output terminal of the buffer circuit unit and the output terminal of the Y-drive line are connected to each other by the fourth switch.

The storage capacitor may have a capacitance that is several times higher than that of the variable capacitor.

The third switch may be turned off in response to the first clock signal and turned on in response to the second clock signal; and the fourth switch may be turned on in response to the first clock signal and turned off in response to the second clock signal.

The first clock signal and the second clock signal may be clock signals that do not overlap each other.

Each of the third and fourth switches may be a PMOS transistor, an NMOS transistor, or a CMOS transistor.

The buffer circuit unit may be an operational amplifier.

The non-inverted input terminal of the operational amplifier may be connected to the output terminal of the third switch; and the inverted input terminal of the operational amplifier may be connected to the output terminal of the operational amplifier and the output terminal of the fourth switch.

The charge transfer circuit may further include an additional buffer circuit unit configured such that the input terminal thereof is connected to the output terminal of the buffer circuit unit and the output terminal thereof is connected to the output terminal of the fourth switch.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
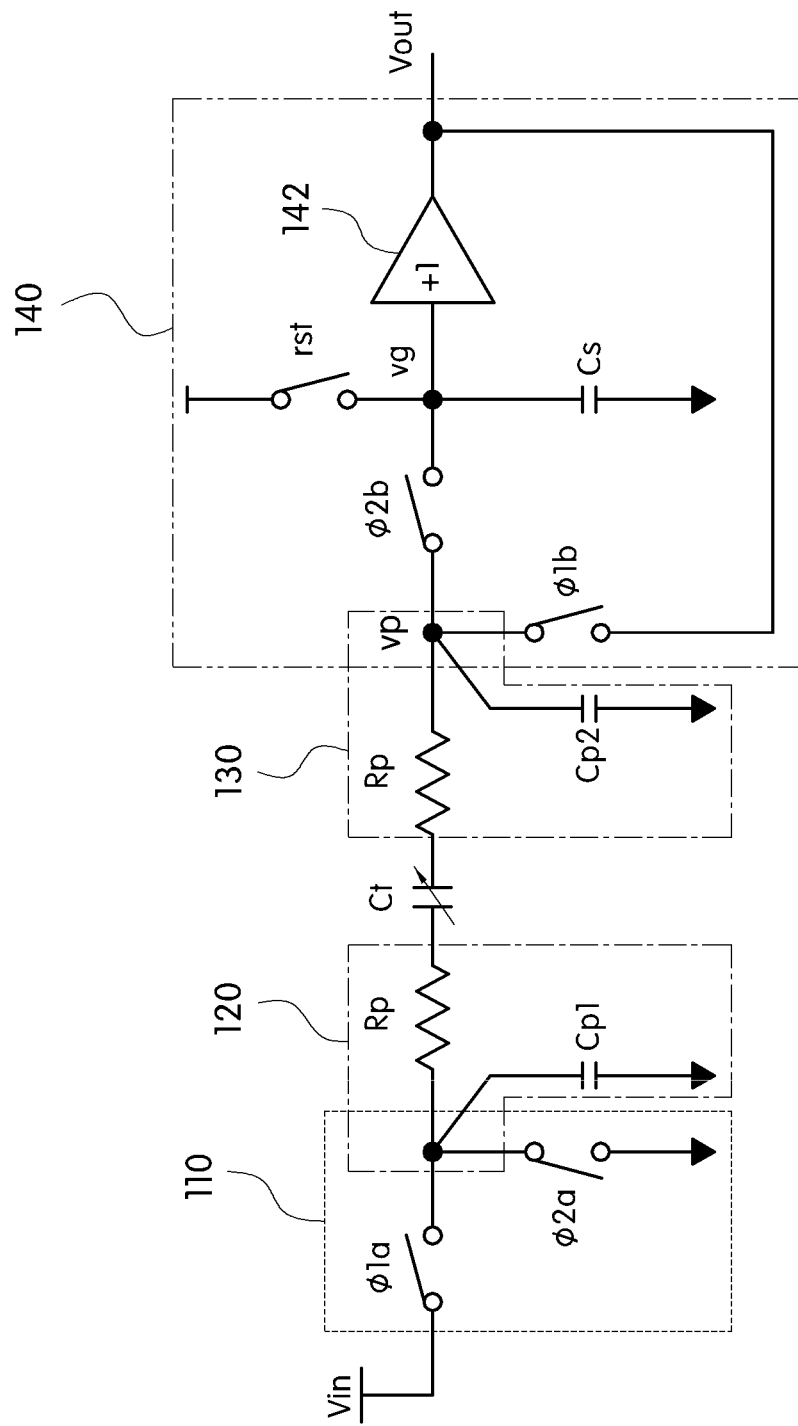
FIG. 1 is a circuit diagram illustrating a charge transfer circuit for capacitive sensing according to an embodiment of the present invention.

Example embodiments of the present invention are described in detail below with reference to the accompanying diagrams. The advantages and features of the present invention and methods for achieving them will be apparent from the embodiments that are described in detail below in conjunction with the accompanying diagrams. However, the present invention is not limited to these embodiments, but may be implemented in other forms. Rather, the embodiments herein are provided to make disclosure more thorough and complete and to teach the spirit of the present invention to those skilled in the art to which the present invention pertains. The present invention is defined only by the attached claims. The same reference numerals designate the same components throughout the specification.

The terms used herein are intended merely to describe embodiments, but are not intended to limit the present invention. Unless otherwise stated clearly, a singular expression includes a plural expression. In the specification and claims, it should be understood that the term "comprise," "include," "have" and their variants are intended merely to designate the presence of features, numbers, steps, operations, elements, parts or combinations thereof described in the specification, and should not be construed as excluding the presence or additional probability of one or more different features, numbers, steps, operations, elements, parts or combinations thereof. Furthermore, since example embodiments are described, reference numerals assigned in order of description are not necessarily limited to the order.

The embodiments of the present invention are described with reference to cross-sectional views, plan views and/or perspective views that represent ideal example embodiments of the present invention in detail. In the drawings, the shapes and sizes of components may be exaggerated to effectively illustrate technical features. Therefore, various modifications of diagrams, for example modifications of manufacturing methods and/or specifications, are expected. Accordingly, exemplary embodiments are not limited to specific shapes of shown regions, and for example, also include modifications of the shape by manufacturing. For example, regions shown or described as flat may generally have rough or rough and nonlinear characteristics. Further, portions shown to have sharp angles may be rounded. Therefore, the regions shown in the drawings are basically just schematic and the shapes of those are not intended to show the exact shapes of the region and are also not intended to reduce the scope of the present invention.

Figure 2:
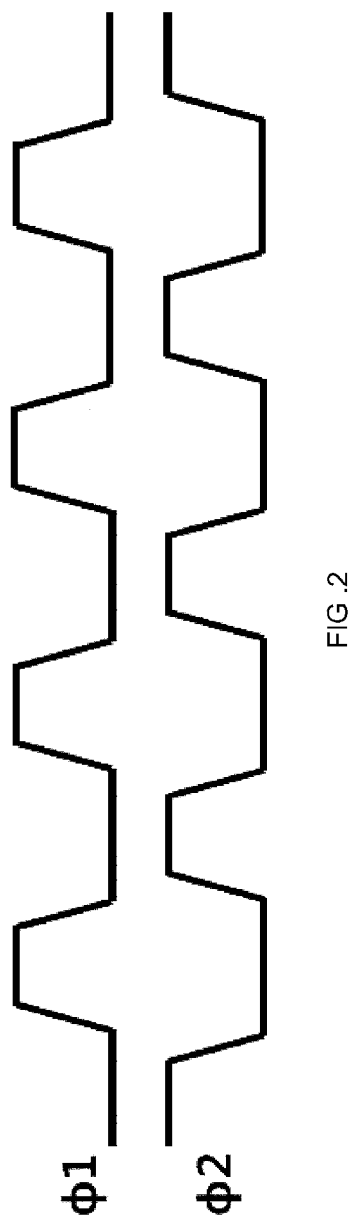
FIG. 2 illustrates switch control signals that are applied to the charge transfer circuit for capacitive sensing according to the embodiment of the present invention.

FIG. 1 is a circuit diagram illustrating a charge transfer circuit for capacitive sensing according to an embodiment of the present invention, and FIG. 2 illustrates switch control signals that are applied to the charge transfer circuit for capacitive sensing according to the embodiment of the present invention.

Referring to FIGS. 1 and 2, the charge transfer circuit for capacitive sensing may include an X-drive part 110, an X-drive line 120, an Y-drive line 130, a variable capacitor Ct defined between the X-drive line 120 and the Y-drive line 130 by the X-drive line 120 and the Y-drive line 130, and an Active output Voltage Feedback (AVF) part 140.

The X-drive unit 110 may be connected between the input terminal of the X-drive line 120 and a voltage input terminal Vin. The X-drive unit 110 may include a first switch $\phi 1a$ configured to be turned on in response to a first clock signal $\phi 1$ and to be turned off in response to a second clock signal $\phi 2$ and a second switch $\phi 2a$ configured to be turned off in response to the first clock signal $\phi 1$ and to be turned on in response to the second clock signal $\phi 2$. The output terminal of the first switch $\phi 1a$ may be connected to the input terminal of the X-drive line 120, and the input terminal of the first switch $\phi 1a$ may be connected to the voltage input terminal Vin. The input terminal of the second switch $\phi 2a$ may be connected to the input terminal of the X-drive line 120 and the output terminal of the first switch $\phi 1a$, and the output terminal of the second switch $\phi 2a$ may be grounded.

A preset voltage or "reset voltage" may be applied to the voltage input terminal Vin. In this case, the term "reset voltage" implies that bias may be adjusted in order to achieve a desired degree of charge transfer.

As illustrated in FIG. 2, the first clock signal $\phi 1$ and the second clock signal $\phi 2$ may be clock signals that do not overlap each other.

The X-drive line 120 and the Y-drive line 130 may have their respective parasitic resistors Rp and their respective parasitic capacitors Cp1 or Cp2. That is, the parasitic resistors Rp may be connected to respective terminals of the variable capacitor Ct, and the input terminals of the parasitic capacitors Cp1 or Cp2 may be connected to the input terminal of the parasitic resistor Rp and the output terminal of the parasitic resistor Rp, respectively, and the output terminals of the parasitic capacitors Cp1 or Cp2 may be grounded.

The AVF part 140 may be connected between the output terminal of the Y-drive line 130 and a voltage output terminal Vout. The AVF part 140 may include third switch $\phi 2b$ and fourth switch $\phi 1b$ configured such that input terminals thereof are connected in parallel to the output terminal of the Y-drive line 130, a buffer circuit unit 142 configured such that the input terminal thereof is connected to the output terminal of the third switch $\phi 2b$, a reset switch rst configured such that the output terminal thereof is connected to the output terminal of the third switch $\phi 2b$ and the input terminal of the buffer circuit unit 142 and such that the input terminal thereof is connected to a reset voltage input terminal, and a storage capacitor Cs configured such that the input terminal thereof is connected to the output terminal of the third switch $\phi 2b$ and the input terminal of the buffer circuit unit 142 and such that the output terminal thereof is grounded. The output terminal of the buffer circuit unit 142 and the output terminal of the Y-drive line 130 may be connected to each other by the fourth switch $\phi 1b$.

Generally, charges flow from a high-voltage side to a low-voltage side until the voltages of both sides become equal. Accordingly, in order to eliminate the parasitic effect of the parasitic capacitor Cp2 of the Y-drive line 130 when charges are transferred from the variable capacitor Ct storage capacitor Cs, it is necessary to charge the parasitic capacitor Cp2 of the Y-drive line 130 so that the voltage of the output terminal vp of the Y-drive line 130 is made to be equal to the voltage of the input terminal vg of the buffer circuit unit 142. In order to prevent charges from being transferred from the parasitic capacitor Cp2 of the Y-drive line 130, an output voltage may be supplied to a voltage follower and fed back to the fourth switch φ1b. When the first clock signal φ1 that makes the first switch φ1a and the fourth switch φ1b be turned on is high, the parasitic capacitor Cp2 of the Y-drive line 130 may be charged such that the voltage of the output terminal vp of the Y-drive line 130 is made equal to the voltage of the input terminal vg of the buffer circuit unit 142 by a feedback output voltage generated by the voltage follower of the input terminal vg of the buffer circuit unit 142. As a result, charges stored in the parasitic capacitor Cp2 of the Y-drive line 130 do not influence an output voltage. A circuit configured to perform the above operations is referred to as the "AVF part 140" herein.

The transfer function of a charge transfer circuit for capacitive sensing according to an embodiment of the present invention may be expressed by the following Equation 1:

$$H(Z) = -\frac{C_t}{C_t + C_p + C_s} \frac{1}{Z-1} \quad (1)$$

where Z is the parameter of a z-transform, $C_t$ is the capacitance of the variable capacitor Ct, $C_s$ is the capacitance of the storage capacitor Cs, and $C_p$ is the capacitance of the parasitic capacitor Cp.

The transfer function of the charge transfer circuit for capacitive sensing according to this embodiment of the present invention has a negative relationship between its input and output. While charges are being transferred from the variable capacitor Ct to the storage capacitor Cs, the voltage of the input terminal vg of the buffer circuit unit 142 changes. The change in voltage deteriorates the linearity of the charge transfer circuit for capacitive sensing. Accordingly, the resulting transfer function may be approximately the same as the transfer function of a conventional switched capacitor integrator.

A variation in voltage, which is the quantity of charges transferred from the variable capacitor Ct to the storage capacitor Cs may be expressed by the following Equation 2:

$$\Delta V_{out}(Z) = -\frac{C_t}{C_t + C_p + C_s} V_{dd} \quad (2)$$

where $V_{dd}$ is an input voltage at the voltage input terminal.

Figure 3:
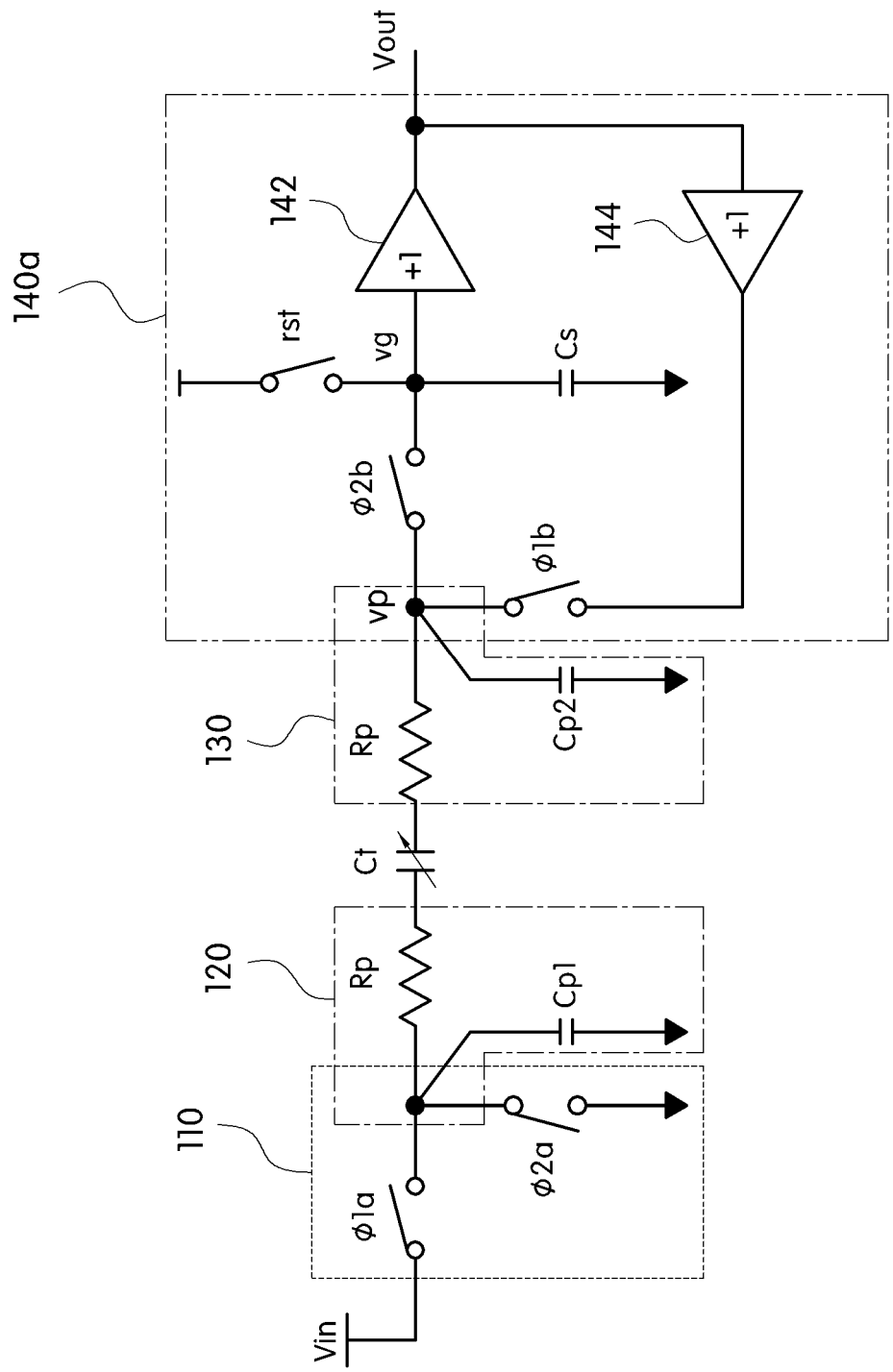
FIGS. 3 and 4 are circuit diagrams illustrating charge transfer circuits for capacitive sensing according to other embodiments of the present invention.
Figure 4:
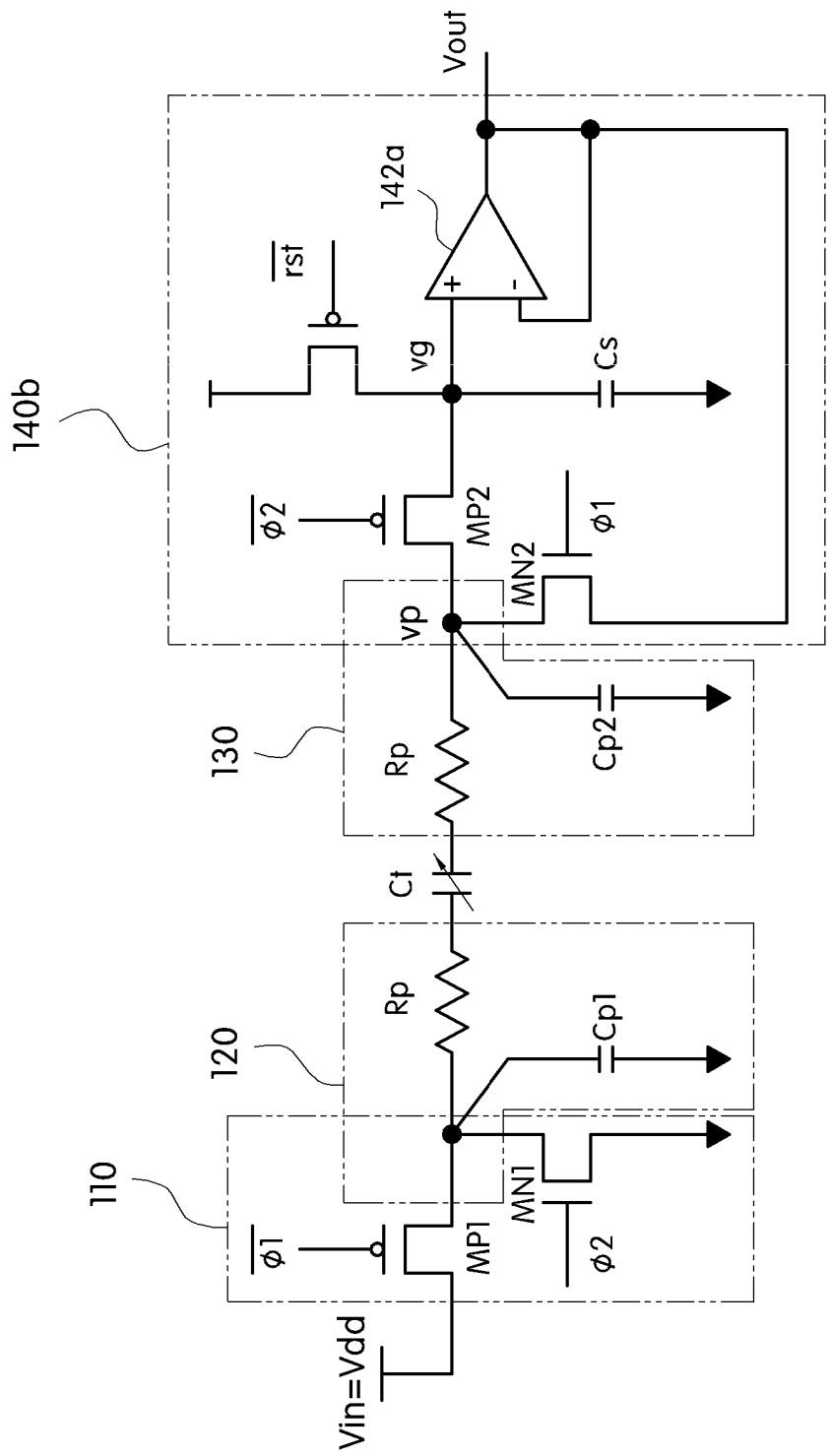

Charge transfer circuits for capacitive sensing according to other embodiments of the present invention are described below with reference to FIGS. 3 and 4. FIGS. 3 and 4 are circuit diagrams illustrating the charge transfer circuits for capacitive sensing according to these embodiments of the present invention. The same reference numerals are assigned to the same components throughout FIGS. 1, 3 and 4, and detailed descriptions of the same components are omitted.

The charge transfer circuit for capacitive sensing according to this embodiment of the present invention, which is described with reference to FIG. 3, is different from the charge transfer circuit for capacitive sensing according to the above-described first embodiment of the present invention in that an AVF part 140a further includes an additional buffer circuit unit 144.

This charge transfer circuit for capacitive sensing may include the additional buffer circuit unit 144 between the buffer circuit unit 142 and the fourth switch φ1b. The AVF part 140a may feedback the output voltage to a fourth switch φ1b more stably by means of the additional buffer circuit unit 144.

The charge transfer circuit for capacitive sensing according to this embodiment of the present invention, which is described with reference to FIG. 4, is different from the charge transfer circuit for capacitive sensing according to the above-described first embodiment of the present invention in that a p-channel metal-oxide semiconductor (PMOS) transistor or an n-channel metal-oxide semiconductor (NMOS) transistor is used as each switch and an operational amplifier (OP-AMP) 142a is used as a buffer circuit unit of an AVF part 140b. However, the present invention is not limited to the case where a PMOS transistor or an NMOS transistor is used as each switch. Although not illustrated, a complementary metal-oxide semiconductor (CMOS) transistor may be used as each switch, or another type of device having a switching function may be used as each switch.

A first switch MP1 and a third switch MP2 are PMOS transistors, and a second switch MN1 and a fourth switch MN2 are NMOS transistors. The first switch MP1 and the fourth switch MN2 may be turned on in response to the first clock signal φ1, and may be turned off in response to the second clock signal φ2. The second switch MN1 and the third switch MP2 may be turned off in response to the first clock signal φ1, and may be turned on in response to the second clock signal φ2.

The non-inverted input terminal + of the operational amplifier 142a may be connected to the output terminal of the third switch MP2, and the inverted input terminal − of the operational amplifier 142a may be connected to the output terminal of the operational amplifier 142a and the output terminal of the fourth switch MN2. Accordingly, an output voltage may be fed back to the fourth switch MN2.

FIGS. 5 to 8 are graphs illustrating the characteristics of the charge transfer circuit for capacitive sensing according to the embodiments of the present invention. These diagrams are graphs illustrating the characteristic test results of the charge transfer circuits fabricated using 0.35 μm CMOS technology.

Figure 5:
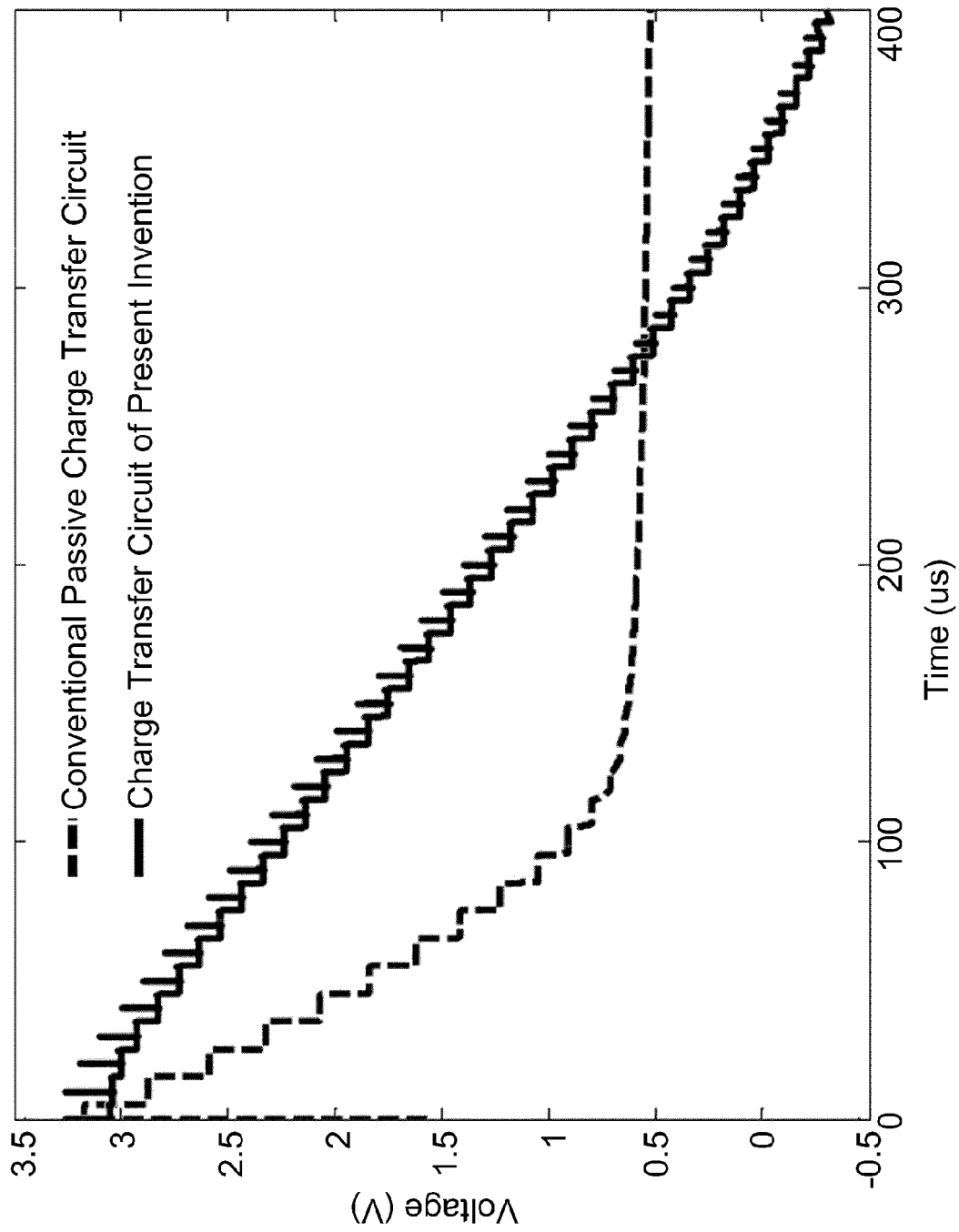
FIGS. 5 to 8 are graphs illustrating the characteristics of the charge transfer circuit for capacitive sensing according to the embodiments of the present invention.

Referring to FIG. 5, there is illustrated a graph illustrating the time domain voltage output characteristics of a conventional passive charge transfer circuit and the charge transfer circuit for capacitive sensing according to the present invention during charge transfer. The input voltage Vin was fixed to $V_{dd}$ so that charges could be maximally transferred from the variable capacitor Ct to the storage capacitor Cs. Since the variable resistor Rp influences only charge transfer timing, only the values of the parasitic capacitances were varied in order to focus on the influence of the parasitic capacitance of the parasitic capacitors Cp1 or Cp2. It was assumed that the parasitic resistors Rp of the X-drive line 120 and the Y-drive line 130 were 10 kΩ and the storage capacitor Cs was 30 pF. Furthermore, it was assumed that when a touch was applied to a touch screen panel, 1.3 pF was generated at a touch point (an intersection between the X-drive line 120 and the Y-drive line 130) and a capacitance value at the touch point varied by about 25%. Two different 1-MHz clock signals that did not overlap each other controlled four switches in order to perform a charge transfer operation.

The voltage difference per single charge transfer in the charge transfer circuit for capacitive sensing according to the present invention was about 90 mV, which is equal to the theoretical variation $\Delta V_{out}$ in voltage, which is represented by Equation 2. It can be seen from FIG. 5 that the linearity of the output voltage was maintained throughout the overall voltage range.

Figure 6:
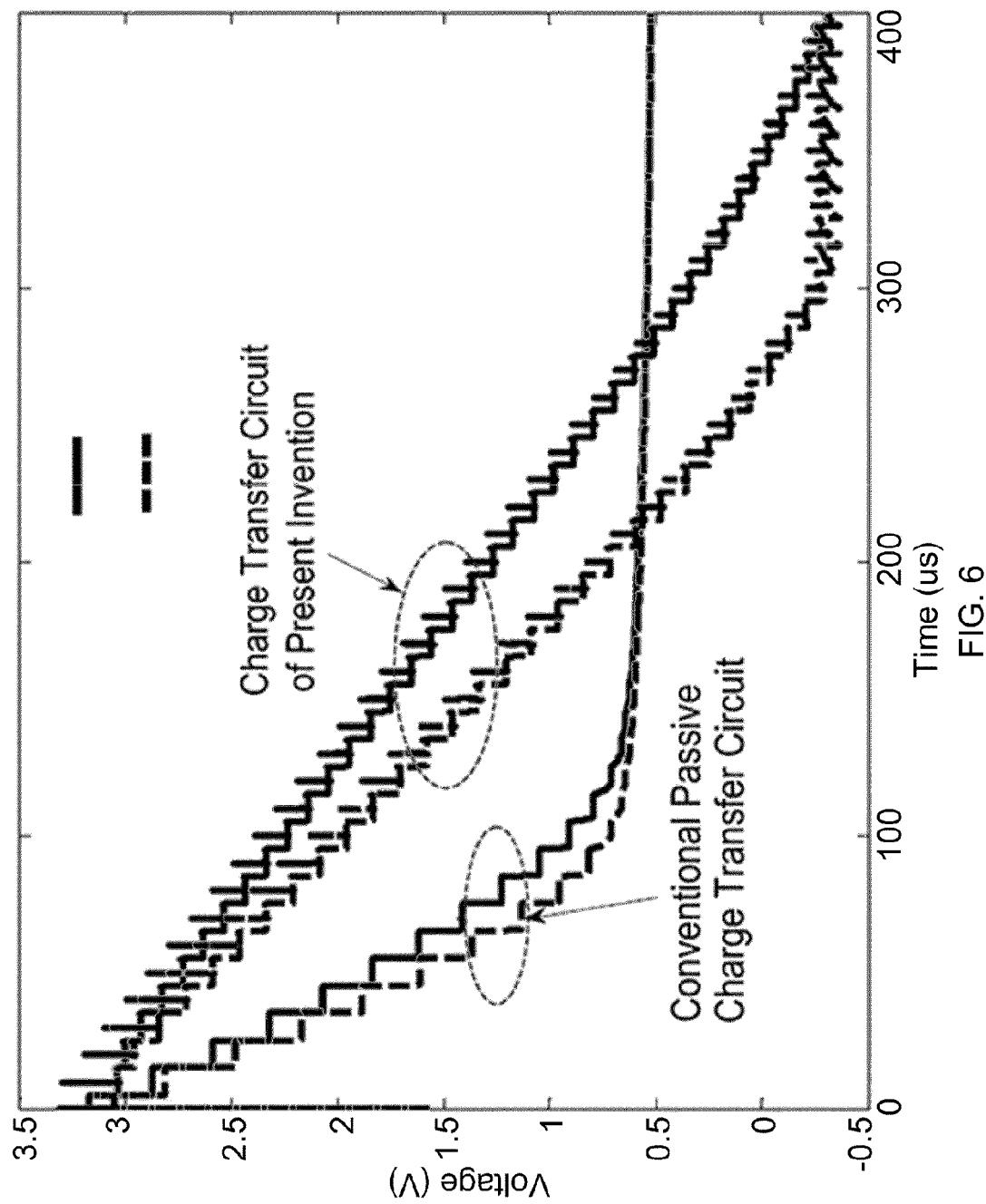

Referring to FIG. 6, there is illustrated a graph illustrating the time domain voltage output characteristics of the conventional passive charge transfer circuit and the charge transfer circuit for capacitive sensing according to the present invention in touch and non-touch states during charge transfer. It was assumed that there was a difference of about 25% in the value of the variable capacitor Ct between touch and non-touch states. It was assumed that there was no parasitic capacitance.

After six charges had been transferred, the maximum difference in voltage between the touch and non-touch states of the conventional passive charge transfer circuit was about 350 mV, and the maximum difference in voltage was 700 mV between the touch and non-touch states of the charge transfer circuit for capacitive sensing according to the present invention. From these results, it can be seen that the parasitic capacitance was effectively eliminated from the charge transfer circuit for capacitive sensing according to the present invention.

Figure 7:
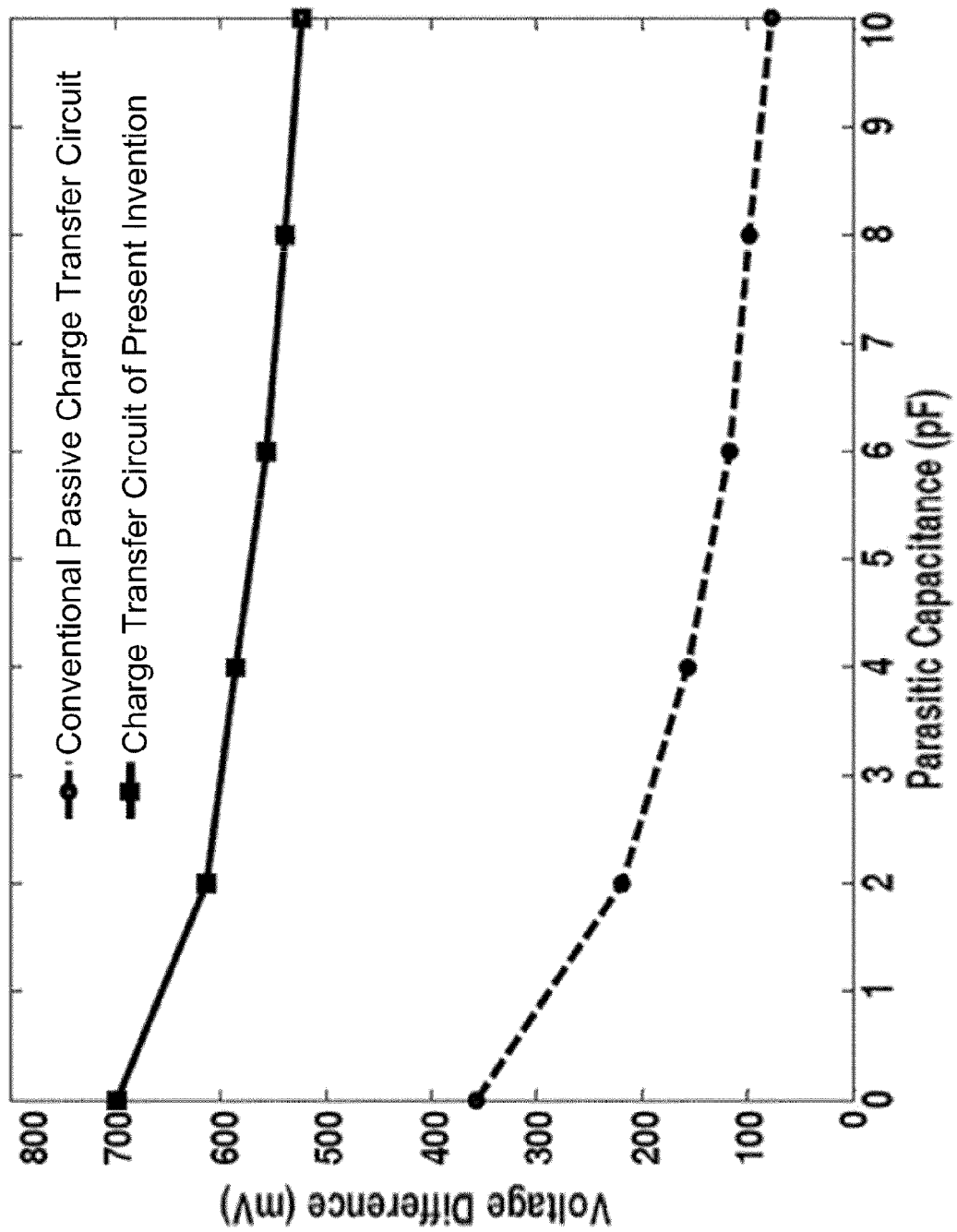

Referring to FIG. 7, there is illustrated a graph schematically illustrating the voltage differences between touch and non-touch states having various parasitic capacitances with respect to the conventional passive charge transfer circuit and the charge transfer circuit for capacitive sensing according to the present invention. This graph is used to analyze touch sensitivity.

As illustrated in FIG. 7, it can be seen that the voltage difference between the touch and non-touch states of the charge transfer circuit for capacitive sensing according to the present invention, which had various parasitic capacitances, was about twice higher than the conventional passive charge transfer circuit having no parasitic capacitance. The voltage difference of the charge transfer circuit for capacitive sensing according to the present invention, which had a parasitic capacitance of 10 pF, was about 520 mV, which is five times higher than that of the conventional passive charge transfer circuit. Apparently, this voltage difference is directly associated with touch sensitivity.

In order to analyze relative touch sensitivity in detail, the relative voltage differences between touch and non-touch states may be defined by the following Equation 3:

$$V_{diff-ratio}(\%) = \frac{\Delta V_{parasitic}}{\Delta V_{no-parasitic}} \times 100 \quad (3)$$

Figure 8:
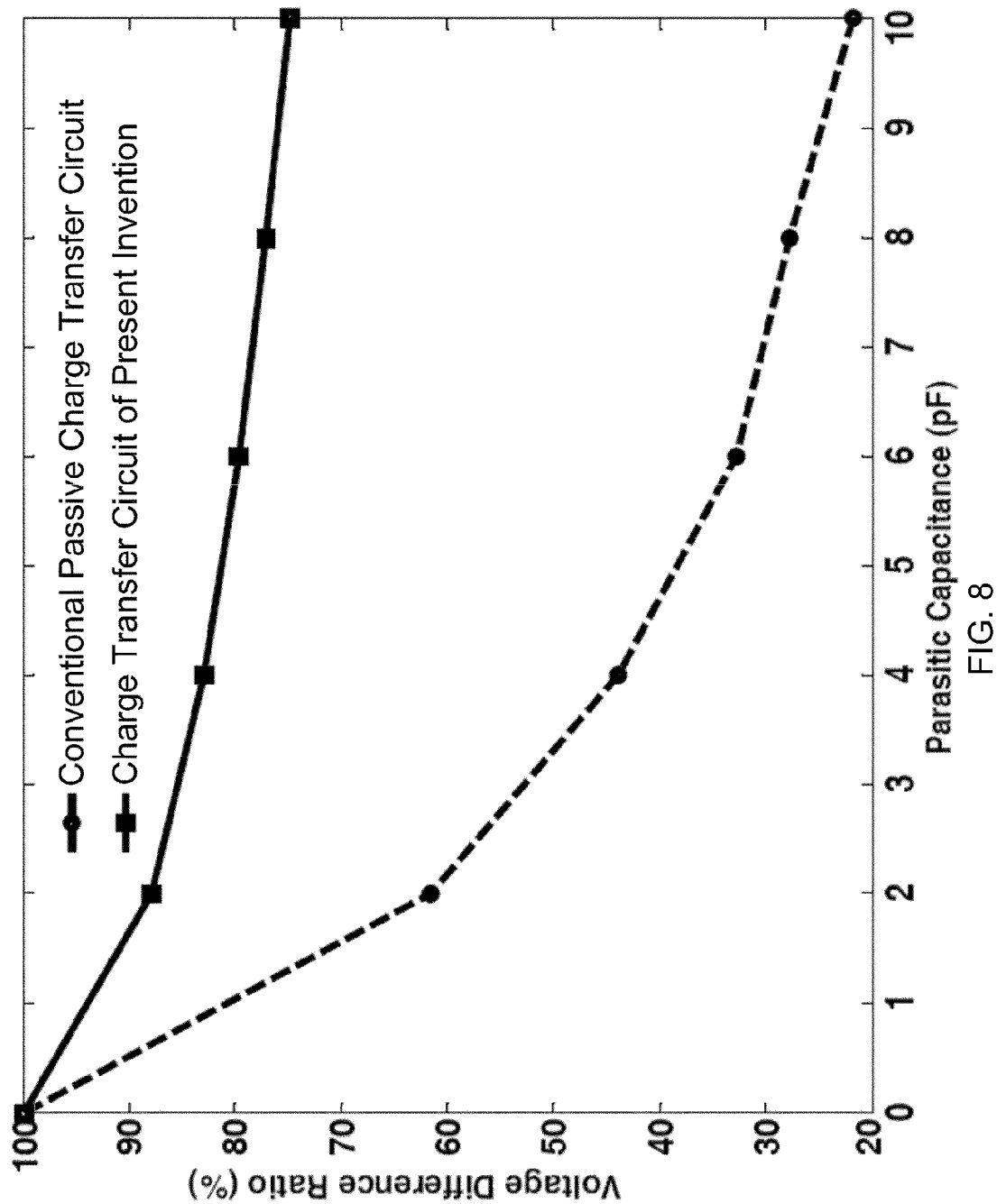

Referring to FIG. 8, there is illustrated a graph illustrating relative differences in voltage between touch and non-touch states having various parasitic capacitances with respect to the conventional passive charge transfer circuit and the charge transfer circuit for capacitive sensing according to the present invention.

As illustrated in FIG. 8, the voltage difference ratio of the conventional passive charge transfer circuit decreased rapidly. Accordingly, the conventional passive charge transfer circuit having a parasitic capacitance of 10 pF achieved only 20% of an initial voltage difference. In contrast, the charge transfer circuit for capacitive sensing according to the present invention achieved a voltage difference ratio equal to 75% of the maximum initial voltage difference. This implies that the charge transfer circuit for capacitive sensing according to the present invention is relatively insensitive to the parasitic capacitance.

The charge transfer circuits for capacitive sensing according to the embodiments of the present invention include AVF parts configured to feed back the output voltage and charge the parasitic capacitor of the Y-drive line, thereby minimizing a parasitic effect attributable to parasitic elements. Accordingly, the present invention provides a charge transfer circuit for capacitive sensing, which can sense capacitance without a reduction in linearity and can be also used effectively in a capacitive sensor having improved touch sensitivity over a wide dynamic range.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A charge transfer circuit for capacitive sensing, comprising:
   a variable capacitor disposed between an output terminal of an X-drive line and an input terminal of a Y-drive line;
   an X-drive unit connected between an input terminal of the X-drive line and a voltage input terminal; and
   an active output voltage feedback (AVF) part connected between an output terminal of the Y-drive line and a voltage output terminal;
   wherein an output terminal of the AVF part is connected to the output terminal of the Y-drive line,
   wherein each of the X-drive line and the Y-drive line comprises:
   a parasitic resistor configured such that an output or input terminal thereof is connected to the variable capacitor; and
   a parasitic capacitor configured such that an input terminal thereof is connected to an input or output terminal of the parasitic resistor.

2. The charge transfer circuit of claim 1, wherein an output terminal of the parasitic capacitor is grounded.

3. The charge transfer circuit of claim 1, wherein the X-drive unit comprises:
   a first switch configured to be turned on in response to a first clock signal and to be turned off in response to a second clock signal; and
   a second switch configured to be turned off in response to the first clock signal and to be turned on in response to the second clock signal.

4. The charge transfer circuit of claim 3, wherein the first clock signal and the second clock signal are clock signals that do not overlap each other.

5. The charge transfer circuit of claim 3, wherein each of the first and second switches is a p-channel metal-oxide semiconductor (PMOS) transistor, a re-channel metal-oxide semiconductor (NMOS) transistor or a complementary metal-oxide semiconductor (CMOS) transistor.

6. The charge transfer circuit of claim 1, wherein a preset voltage is applied to the voltage input terminal.

7. The charge transfer circuit of claim 1, wherein the AVF part comprises:
   third and fourth switches configured such that input terminals thereof are connected to the output terminal of the Y-drive line;
   a buffer circuit unit configured such that an input terminal thereof is connected to an out terminal of the third switch;
   a reset switch configured such that an output terminal thereof is connected to the output terminal of the third switch and the input terminal of the buffer circuit unit and such that an input terminal thereof is connected to a reset voltage input terminal; and a storage capacitor configured such that an input terminal thereof is connected to the output terminal of the third switch and the input terminal of the buffer circuit unit and such that an output terminal thereof is grounded;

wherein an output terminal of the buffer circuit unit and the output terminal of the Y-drive line are connected to each other by the fourth switch.

8. The charge transfer circuit of claim 7, wherein the storage capacitor has a capacitance that is ten times higher than that of the variable capacitor.

9. The charge transfer circuit of claim 7, wherein:
the third switch is turned off in response to the first clock signal and turned on in response to the second clock signal; and
the fourth switch is turned on in response to the first clock signal and turned off in response to the second clock signal.

10. The charge transfer circuit of claim 9, wherein the first clock signal and the second clock signal are clock signals that do not overlap each other.

11. The charge transfer circuit of claim 7, wherein each of the third and fourth switches is a PMOS transistor, an NMOS transistor, or a CMOS transistor.

12. The charge transfer circuit of claim 7, wherein the buffer circuit unit is an operational amplifier.

13. The charge transfer circuit of claim 12, wherein:

a non-inverted input terminal of the operational amplifier is connected to the output terminal of the third switch; and an inverted input terminal of the operational amplifier is connected to an output terminal of the operational amplifier and an output terminal of the fourth switch.

14. The charge transfer circuit of claim 7, further comprising an additional buffer circuit unit configured such that an input terminal thereof is connected to the output terminal of the buffer circuit unit and an output terminal thereof is connected to an output terminal of the fourth switch.

* * * * *